United States Patent
Jin et al.

(10) Patent No.: US 10,128,826 B2
(45) Date of Patent: Nov. 13, 2018

(54) CLOCK SYNTHESIZER WITH INTEGRAL NON-LINEAR INTERPOLATION (INL) DISTORTION COMPENSATION

(71) Applicant: Microsemi Semiconductor ULC, Kanata (CA)

(72) Inventors: Qu Gary Jin, Kanata (CA); Kamran Rahbar, Kanata (CA)

(73) Assignee: Microsemi Semiconductor ULC, Kanata, ON (CA)

(*) Notice: Subject to any disclaimer, the term of this patent is extended or adjusted under 35 U.S.C. 154(b) by 0 days.

(21) Appl. No.: 15/824,139

(22) Filed: Nov. 28, 2017

(65) Prior Publication Data

US 2018/0205370 A1 Jul. 19, 2018

Related U.S. Application Data

(60) Provisional application No. 62/447,583, filed on Jan. 18, 2017.

(51) Int. Cl.
*H03B 21/00* (2006.01)
*H03K 5/1252* (2006.01)
*H03L 7/099* (2006.01)
*H03L 7/091* (2006.01)
*H03K 5/00* (2006.01)

(52) U.S. Cl.
CPC .......... *H03K 5/1252* (2013.01); *H03L 7/091* (2013.01); *H03L 7/0991* (2013.01); *H03K 2005/00052* (2013.01); *H03K 2005/00058* (2013.01); *H03L 2207/50* (2013.01)

(58) Field of Classification Search
CPC ....... H03K 5/1252; H03K 2005/00058; H03K 2005/00052; H03L 7/0991; H03L 7/091
USPC ........................................................ 327/106
See application file for complete search history.

(56) References Cited

U.S. PATENT DOCUMENTS 8,692,599 B2   4/2014   Gong et al.

OTHER PUBLICATIONS

CircuitVision Analysis of the Crystal Oscillator, DCO Circuitry and Output Buffers on the Silicon Labs Si5345 Clock Generator (TechInsights 2014).

*Primary Examiner* — Lincoln D Donovan
*Assistant Examiner* — Metasebia Retebo
(74) *Attorney, Agent, or Firm* — Simon Kahn

(57) ABSTRACT

A method of compensating for integral nonlinear interpolation (INL) distortion in a clock synthesizer driven by a system clock running at a frequency $f_{sys}$, involves introducing a selected nominal analog delay I*dt with an actual delay of I*dt+δ at the output of the a first path with a digital controlled oscillator (DCO) and a digital-to-time converter (DTC) and a nominal digital delay I*D with an actual delay of I*D+Δ at the input of a second path with a DCO and a DTC that offsets the actual analog delay in the first path, adjusting the contents x(k) of a compensation module in the second path to align the output pulses of the first and second paths for different values of k, where k represents an interpolation point, iteratively repeating the two preceding steps for all N values of I, and averaging the contents x(k) of the compensation module to derive the compensation values to be applied to a one of the DTCs to correct for INL distortion.

22 Claims, 7 Drawing Sheets

CLOCK SYNTHESIZER WITH INTEGRAL NON-LINEAR INTERPOLATION (INL) DISTORTION COMPENSATION

CROSS REFERENCE TO RELATED APPLICATION

This application claims the benefit under 35 USC 119(e) of U.S. provisional application No. 62/447,583, filed, Jan. 18, 2017, the contents of which are herein incorporated by reference.

FIELD OF THE INVENTION

This invention relates to the field of precision timing, and in particular to a method of compensating for non-linear effects during phase interpolation in digital-to-time conversion, and a clock synthesizer for implementing the method.

BACKGROUND OF THE INVENTION

A variety of electronic circuits require the synthesis of extremely accurate clock signals at a precise frequency. One way of achieving this result is to lock a digital phase-locked loop employing a software digital controlled oscillator (SDCO) to generate phase and frequency values from a reference signal, which after suitable conversion, drive a hardware digital or numerical controlled oscillator (DCO/NCO), referred to hereafter as a DCO. This comprises an accumulator that increments by a certain amount on each system pulse. When the accumulator overflows, it generates a carry output, which represents the output pulse. The remainder left in the accumulator when a carry is output represents the phase. The DCO produces clock pulses at the desired overall frequency, but since these pulses are coincident with the system pulses when the carry occurs, they are not generally correctly phased and form a so-called gapped clock signal because when there is no carry no output occurs on some of the system clock pulses.

A digital-to-time converter (DTC) makes use of the phase information provided by the remainder to interpolate the output of the hardware DCO and produce evenly spaced clock pulses in their correct phase locations. Such an arrangement is described in U.S. Pat. No. 8,692,599, the contents of which are herein incorporated by reference.

A problem arises in the prior art due to the fact that the DTC, which is implemented in analog form, is not perfectly linear. The non-linear space between the interpolation points in each system clock pulse period creates output clock jitter that is significantly larger than the resolution of the DTC interpolation as determined by the number M of interpolation points k. Pre-calibration is generally used to eliminate this non-linear distortion, but this has to be constantly adjusted to compensate for temperature variations.

SUMMARY OF THE INVENTION

Embodiments of this invention employ an accurate compensation method that can quickly and adaptively adjust the non-linear distortion in the DTC interpolation and thus create a low jitter output clock. In accordance with embodiments of the invention, two paths are employed, each comprising a DCO and a DTC. A deliberate initial delay is introduced at the input of the second path, which is compensated for by an analog delay introduced into the output of the first path. Varying the initial delay moves the interpolation point for the second path but has no effect on the first path. By averaging measurements for multiple matching pairs of initial and compensating delays, the invention produces discrete average integral non-linear distortion values for each interpolation point k in the first path, and an average integral non-linear distortion value for all M interpolation points over a system clock period in the second path. This average does not vary much with the initial phase value input to the DCO, and therefore can be treated as a constant, which can be allowed for in the final circuitry.

According to the present invention there is provided a method of compensating for integral nonlinear interpolation (INL) distortion in a clock synthesizer driven by a system clock running at a frequency $f_{sys}$, comprising:

(i) providing a first path comprising a first digital controlled oscillator (DCO) responsive to an input frequency value Freq to generate output clock pulses, a first digital-to-time converter (DTC) for linearly interpolating to a series of M interpolation points k between system clock pulses to correct the phase of the output clock pulses, a first compensation module for applying compensation values to the first DTC to correct for INL distortion, and an adjustable delay module for introducing a series of nominal analog delays I*dt, (I=0, 1, . . . N−1), where N*dt=1/$f_{sys}$s, into an output of the first DCT;

(ii) providing a second path comprising a second digital controlled oscillator (DCO) responsive to said input frequency value Freq to generate output clock pulses, a second digital-to-time converter (DTC) for linearly interpolating to a series of M interpolation points k between system clock pulses to correct the phase of the output clock pulses, a delay memory for applying nominal digital delays I*D, (I=0, 1 . . . N−1), where N*D=Freq, to the second DCO, and a second compensation module for applying compensation values to the second DTC to correct for INL distortion;

(iii) introducing a selected nominal analog delay I*dt with an actual delay of I*dt+δ, where δ is a small offset from the nominal delay, at the output of the first path and a nominal digital delay I*D with an actual delay of I*D+Δ, where Δ is a small offset from the nominal delay, at the input of the second path that offsets the actual analog delay in the first path;

(iv) adjusting contents x(k) of the second compensation module to align the output pulses of the first and second paths for different values of k;

(v) iteratively repeating steps (iii) and (iv) for all N values of I; and (vi) averaging the contents x(k) of the second compensation module to derive the compensation values to be applied to a selected one of said DTCs to correct for INL distortion.

Nominally the analog delay I*dt and nominal digital delay I*D are set to the same values to that they offset each other, but in practice the analog delay cannot be precisely set and will have a small offset δ from the nominal delay giving an actual delay of I*dt+δ. The actual digital delay I*D+Δ matching this actual analog delay has to be found. The matching operation can be done in advance for all pairs of analog/digital delays I*dt/I*D, or in one embodiment it can be done concurrently with the determination of the INL compensation values.

It will be appreciated that, as generally the case in an adaptive algorithm, both I and k can be changed randomly so that statistically all pairs of k and I are covered. The sequencing of steps (iii) and (iv) is not important. For example, the system could maintain a fixed value of I and until all values of k are covered, or continually change both I and k so as to eventually cover all combinations of I and k.

In one embodiment, at each iteration, the contents x(k) of the second compensation module are added to a value y(k) stored in a memory according to the equation:

$$y(k)=y(k)+x(k-I_b)$$

where $I_b$ is an index addition bias, and the final summation is divided by N to derive the compensation values for at least one of said first and second paths The index addition bias $I_b$ may be set to zero to obtain the compensation values for the second DTC and to the same value as the initial phase of the second DCO to obtain the compensation values for the first DTC.

According to a second aspect of the invention there is provided a clock synthesizer with nonlinear digital-to-time conversion compensation driven by system clock pulses, comprising:

a first path comprising a first digital controlled oscillator (DCO) responsive to an input frequency value Freq to generate output clock pulses, a first digital-to-time converter (DTC) for linearly interpolating between system clock pulses to correct the phase of the output clock pulses, a first compensation module for applying compensation values to the first DTC to correct for INL distortion, and an adjustable delay module for introducing a series of nominal analog delays I*dt, (I=0, 1, . . . N–1), where N*dt=1/$f_{sys}$s, into an output of the first DCT;

a second path comprising a second digital controlled oscillator (DCO) responsive to said input frequency value Freq to generate output clock pulses, a second digital-to-time converter (DTC) for linearly interpolating to a series of M interpolation points k between system clock pulses to correct the phase of the output clock pulses, and a delay memory for applying nominal initial delays I*D, (I=0, 1 . . . N–1), where N*D=Freq, to the second DCO, and a second compensation module for applying a compensation values to the second DTC to correct for INL distortion;

a controller programmed to:
(i) introduce a selected nominal analog delay I*dt with an actual delay of I*dt+δ at the output of the first path and a nominal digital delay I*D with an actual delay of I*D+Δ at the input of the second path that offsets the actual analog delay in the first path;
(ii) adjust contents x(k) of the second compensation module to align the output clock pulses from the first and second paths for different values of k;
(iii) iteratively repeat steps (i) and (ii) for all N values of I; and
(iv) average the contents x(k) of the second compensation module to derive the compensation values to be applied to a selected one of said DTCs to correct for INL distortion.

According to yet another aspect of the invention there is provided a clock synthesizer with nonlinear digital-to-time conversion compensation driven by system clock pulses, comprising:

a first path comprising a first digital controlled oscillator (DCO) responsive to an input frequency value Freq to generate output clock pulses, a first digital-to-time converter (DTC) for linearly interpolating between system clock pulses to correct the phase of the output clock pulses, a first compensation module for applying compensation values to the first DTC to correct for INL distortion, and an adjustable delay module for introducing a series of nominal analog delays I*dt, (I=0, 1, . . . N–1), where N*dt=1/$f_{sys}$s, into an output of the first DCT;

a second path comprising a second digital controlled oscillator (DCO) responsive to said input frequency value Freq to generate output clock pulses, a second digital-to-time converter (DTC) for linearly interpolating to a series of M interpolation points k between system clock pulses to correct the phase of the output clock pulses, and a delay memory for applying nominal initial delays I*D, (I=0, 1 . . . N–1), where N*D=Freq, to the second DCO, and a second compensation module for applying a compensation values to the second DTC to correct for INL distortion;

a controller programmed to introduce a selected nominal analog delay I*dt with an actual delay of I*dt+δ, where δ is a small offset from the nominal delay, at the output of the first path and a nominal digital delay I*D with an actual delay of I*D+Δ, where Δ is a small offset from the nominal delay, at the input of the second path that offsets the actual analog delay in the first path.

BRIEF DESCRIPTION OF THE DRAWINGS

This invention will now be described in more detail, by way of example only, with reference to the accompanying drawings, in which.

DETAILED DESCRIPTION OF EMBODIMENTS OF THE INVENTION

Figure 1:
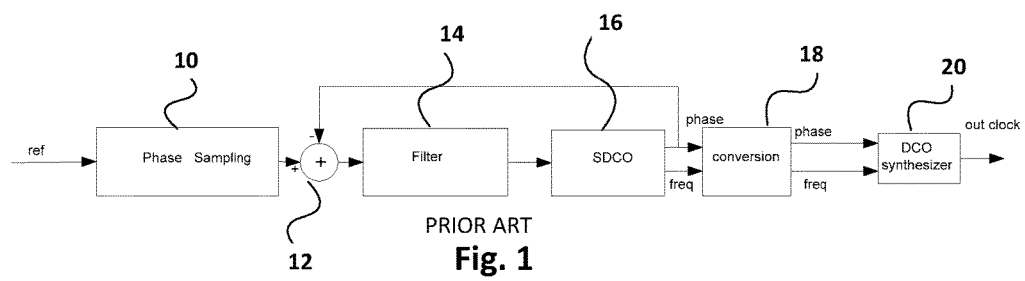
FIG. 1 is a block diagram of a prior art digital phase-locked loop.

The phase locked loop (PLL) shown in FIG. 1 comprises a phase sampler 10 that samples the phase of a reference signal to produce samples that are applied to the plus input of adder 12, the output of which adder 12 is coupled to loop filter 14, which in turn provides the input to SDCO 16 (Software Digitally Controlled Oscillator). The SDCO 16 outputs phase and frequency values that are applied to a converter 18, which provides corresponding inputs to digital or numerically controlled (DCO) synthesizer 20. The phase output of the SDCO 16 is also fed back to the minus input of the adder so that the output of the PLL is locked to the reference signal. It will be appreciated that component 12 is shown as an adder, as is conventional, but when it adds a negative input to a positive input, it is of course acting as a subtractor.

Figure 2:
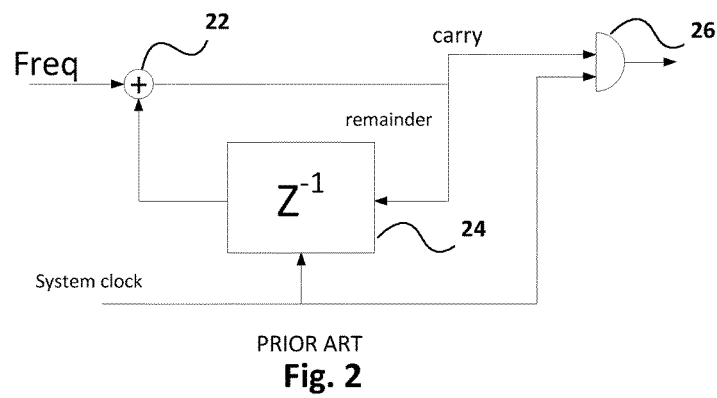
FIG. 2 is a block diagram of a prior art digital controlled oscillator.
Figure 3:
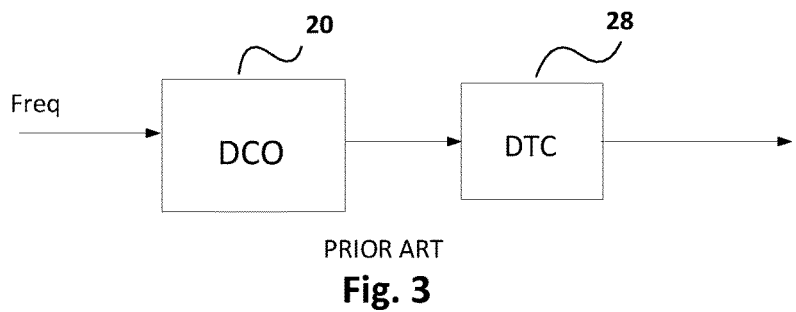
FIG. 3 is a block diagram of a complete clock synthesizer with digital-to-time converter (DTC)

The DCO 20 is shown in more detail in FIG. 2. It comprises an accumulator consisting of adder 22, a delay-by-one sample unit 24, and an AND gate 26. The frequency is determined by the word Freq (essentially a number representing frequency) applied to the input of the adder 22 at each system clock pulse. This word is accumulated in the adder until overflow occurs, at which point a carry is output by AND gate 26 on the next system clock pulse. If the output frequency were an exact sub-multiple of the system clock frequency, the DCO output would be a series of evenly spaced pulses with one or more gaps, representing system pulses, between the gaps. Since this is not generally the case, the output of the DCO 20 comprises a series of pulses with staggered gaps between some of them occurring on the system clock pulses as shown by the middle waveform in FIG. 4.

The overall output frequency matches the desired frequency, but the phase is inaccurate if when overflow occurs there is a remainder value in the accumulator register. This represents the phase (also essentially just a number) information that is used by digital-to-time converter (DTC) 28 (FIG. 4) to interpolate between the system pulses and produce an output clock as shown by the lower waveform in FIG. 4, which consists of a series of correctly phased and evenly spaced pulses. The DTC 28 interpolates to the nearest one (k) of a series of M interpolation points during each system clock period $1/f_{sys}$. The number of interpolation points in each clock pulse period determines the resolution of the system.

Figure 4:
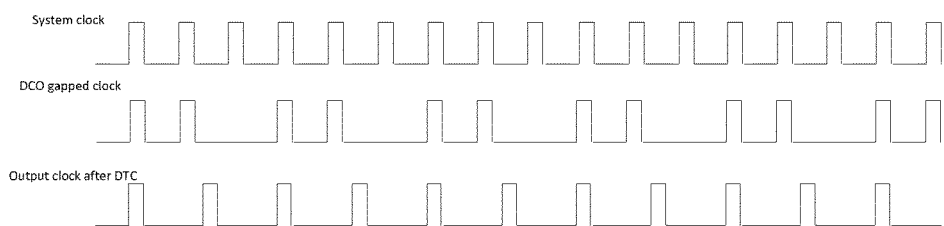
FIG. 4 shows various waveforms of the system clock, the output of the DCO, and the output of the DTC.

Since it is critical to understanding the invention, a simplified example of the operation of the accumulator may be appropriate. If we assume for the sake of argument that the accumulator is a 4-bit counter (in practice it is larger than this) and contains a number, say 7, this represents the phase value because it identifies the point in the accumulator cycle where the carry would occur if the system did not have to wait for the next system clock pulse to generate an output. If a frequency value of say 9 is added to the accumulator on a system clock pulse, the accumulator will reset to zero and output a carry pulse representing the output of the DTC 28. The output pulse will be correctly positioned coincident with the system clock pulse. If the frequency value 9 is added on the next system clock pulse, the phase value in the accumulator will be 9, and no output will be generated. If the frequency value 9 is added again on the next system clock pulse, an output will be generated but the value in the accumulator will roll over to 2 since the accumulator is counting modulo 16. It can thus be seen that the output pulses are uneven (there are gaps between them as shown in FIG. 4) but the remainder value in the accumulator contains the information required by the DTC to place the output pulse in the correct position between system clock pulses to the nearest interpolation point k.

However, as noted above, due to the nonlinearity of the analog circuitry in the DTC, the DTC circuit 28 may not produce a linearly spaced clock output, and the actual phase of an output pulse at an interpolated location k will be $$\text{Phase}/\text{Freq}*1/f_{sys}+\text{INL}(k)$$

where INL(k) is the integral Non-Linear (INL) distortion at interpolated location k. This is a function of phase/Freq, namely the correct position of the output pulse between adjacent clock pulses. INL(k) adds jitter noise to the noise resulting from the limitations imposed by the resolution of DTC interpolation.

Figure 5:
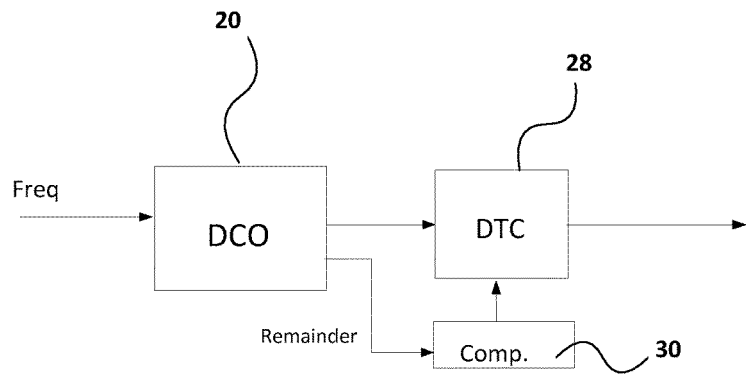
FIG. 5 shows a clock synthesizer with compensator in accordance with one generalized embodiment of the invention.

However, if INL(k) can be estimated, it can be compensated for as shown in FIG. 5 with the aid of compensator 30, which subtracts the measured INL(k) from the output of DTC 28 during operation of the synthesizer. Embodiments of the invention thus correct the operation of the DTC to compensate for the non-linearity in the interpolation procedure.

In a typical PLL application, INL(k) may be constantly changing with temperature, voltage and the DCO frequency. In accordance with embodiments of the invention the values of INL(k) can be adaptively estimated on the basis of principles explained with reference to FIG. 6.

Figure 6:
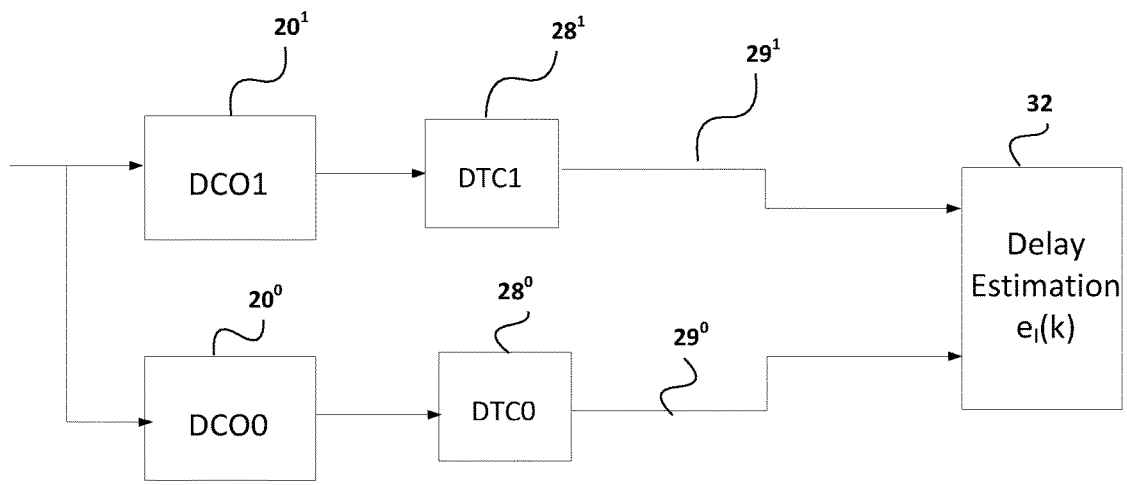
FIG. 6 is a block diagram of clock synthesizer circuit helpful in understanding the principles of the invention.

In the block diagram shown in FIG. 6, two separate paths $29^1$ containing DCO1 $20^1$ and DTC1 $28^1$, and $29^0$ containing DCO0 $20^0$ and DTC0 $28^0$ lead to delay estimation circuit 32. Each path has a common input frequency Freq and separate DTC blocks DTC1 $28^1$ and DTC0 $28^0$, each with its own INL values. To align the two paths, the two DCOs $20^1$ and DCO0 $20^0$ are started over a series of N runs, where N is an integer, with initial different phases, which are loaded into the accumulator of the DCO0 $20^0$. For example, if DCO0's initial phase is 0, DCO1's initial phase will be I*D (I=0, 1, . . . N−1 where N*D=Freq).

Since both DCO0 $20^0$ and DCO1 $20^1$ are driven by the same DCO frequency Freq and the two DCOs $20^0$ $20^1$ start with different initial phases with phase difference of I*D, at any given time, the phase of DCO0 $20^0$ is $\text{phase}_k$ and the phase of DCO1 $20^1$ is $\text{phase}_k$+I*D.

If M is the number of steps of DTC interpolation in a single system clock period $1/f_{sys}$, the DTC resolution is $1/(M*f_{sys})$. Therefore, INL has M values (INL(k), k=0, 1, . . . , M−1), one value for each interpolation step, k.

It should be noted that INL(k+M)=INL(k−M)=INL(k) because INL only represents the non-linear distortion for the fractional portion of the phase (i.e., remainder of the DCO phase), so the value of INL at the same interpolation point k between successive system pulses will always be the same.

Now, if we let $k=\lfloor \text{phase}_k*M/\text{Freq} \rfloor$ be defined as the integer of $(\text{phase}_k*M/\text{Freq})$ (this is true because the DTC only interpolates to discrete points), where $\text{phase}_k$<Freq and k<M, and d=D*M/Freq, the phase difference between the output pulses of the two paths, namely the output of the delay estimation circuit will be:

$$e_f(k)=[(\text{phase}_k+I*D)/\text{Freq}*1/f_{sys}+\text{INL}_1(k+\lfloor I*d \rfloor)]-[\text{phase}_k/\text{Freq}*1/f_{sys}+\text{INL}_0(k)]$$

where $\text{INL}_1(k+\lfloor I*d \rfloor)$ and $\text{INL}_0(k)$ represent INL values for DTC1 and DTC0 respectively.

Since the initial phase $I*D/\text{Freq}*1/f_{sys}$ is known, the above equation be simplified by offsetting the initial phase with a delay circuit in the output of the DTC in that path without the initial delay to give:

$$e_f(k)=\text{INL}_1(k+\lfloor I*d \rfloor)-\text{INL}_0(k)$$

Over a series of system clock pulses, as the value Freq is successively added to the accumulator in the DCOs $20^0$, $20^1$, the DCO will pass through all phases k, giving a set of averaged values $e_f(k)$ where k=0, 1, . . . , M, with a given initial phase difference I*D.

If the same procedure is repeated for different initial phase settings I, the average values with respect to I are $$\frac{1}{N}\sum_{l=0}^{N-1} e_I(k) = \frac{1}{N}\sum_{l=0}^{N-1} INL_1(k + \lfloor I*d \rfloor) - INL_0(k)$$

With a large value N, $$\frac{1}{N}\sum\nolimits_{l=0}^{N-1} INL_1(k + I*d)$$

will be close to a constant and will vary very little with respect to k. If N=M, then because the condition INL(k+M)=INL(k) holds, the summation INL(k)+INL(k+1)+ . . . +INL(k+M) is independent of value k and is the same as INL(0)+INL(1)+ . . . +INL(M−1). If N<M, the summation will vary slightly but will be close to a constant provided N is large enough.

The average of $e_I(k)$ will give an INL value $INL_0(k)$ with a reverse sign and a small constant bias. The constant bias does not affect the jitter performance. This average value can be applied to the compensation module 30 to cancel the INL for DTC0.

In a similar manner, if instead of summing with respect to $e_I(k)$, we sum with respect to $e_I(k-\lfloor I*d \rfloor)$, we have $$\frac{1}{N}\sum_{l=0}^{N-1} e_I(k - \lfloor I*d \rfloor) = INL_1(k) - \frac{1}{N}\sum_{l=0}^{N-1} INL_0(k - \lfloor I*d \rfloor)$$

By similar reasoning the average value of $$\frac{1}{N}\sum\nolimits_{l=0}^{N-1} INL_0(k - \lfloor I*d \rfloor)$$

remains substantially constant. As a result the INL values for DTC1 can be obtained to permit DTC1 to be compensated.

Figure 7:
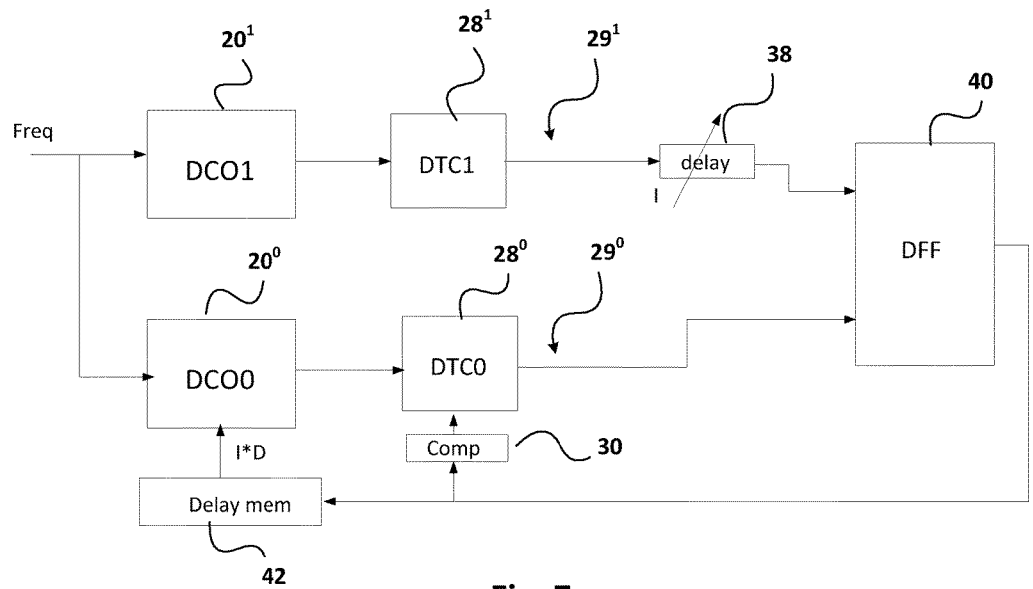
FIG. 7 is a block diagram of a clock synthesizer with nonlinear compensation and an added delay line in accordance with the general principles of the invention.

It is noted that in the above reasoning the initial delay is subtracted from the equation. This is achieved in theory, as shown in FIG. 7, by introducing an analog delay at the output of the DTC in the other path. In FIG. 7, an initial digital delay is introduced into the DCO0 $20^0$ of path $29^0$ and an offsetting analog delay is introduced into the output of the other path $29^1$ by adjustable delay module 38 downstream of DTC1 $28^1$. The adjustable delay module has N variable delays I*dt: 0, dt, 2dt, . . . , (N−1)dt, and with dt being selected such that N*dt=1/$f_{sys}$. The delay module 38 provides one input to the D-type flip-flop DFF 40, the other input of which is coupled to the output of DTC0 $28^0$. The output of DFF 40 is coupled to compensation module 30 and delay memory 42, which sets the initial delay I*D.

When the two clocks are aligned in FIG. 7, the output of the DFF 40 will be approximately zero. At this point, I*D/Freq*1/$f_{sys}$ matches the selected nominal analog delay I*dt (I=0, 1, . . . , N−1), so the value in the compensation memory for DTC0 will be:

$e_I(k)$=[phase$_k$/Freq*1/$f_{sys}$+INL$_1$(k+$\lfloor I*d \rfloor$)−I*dt]−
  [(phase$_k$−I*D)/Freq*1/$f_{sys}$+INL$_0$(k)]

If the initial phase I*D/Freq*1/$f_{sys}$ in DCO0 cancelled the analog delay I*dt, we have the same result as obtained in connection with FIG. 6, namely that the above equation can be simplified to:

$e_I(k)$=INL$_1$(k+$\lfloor I*d \rfloor$)−INL$_0$(k)

The problem with the arrangement shown in FIG. 7 is that the analog delay cannot be set with the necessary degree of precision to precisely cancel the digital delay introduced into DCO0 $20^0$, so in practice the analog delay is introduced first and the digital delay must be adjusted accordingly. The first task is to set analog delay I*dt and corresponding digital delay I*D, and align the two paths by adjusting both the initial delay memory for DCO0. For this purpose, we need to distinguish between the nominal analog delay I*dt and the actual analog delay I*dt+δ, where δ is the small offset due to the imprecision in the analog circuitry. In order to offset the actual analog delay I*dt+δ, the nominal digital delay I*D needs to be offset be a small amount Δ to an actual delay I*D+Δ. The first task is to find the matching pairs of actual delays I*dt+δ and I*D+Δ for each value of I.

Figure 8:
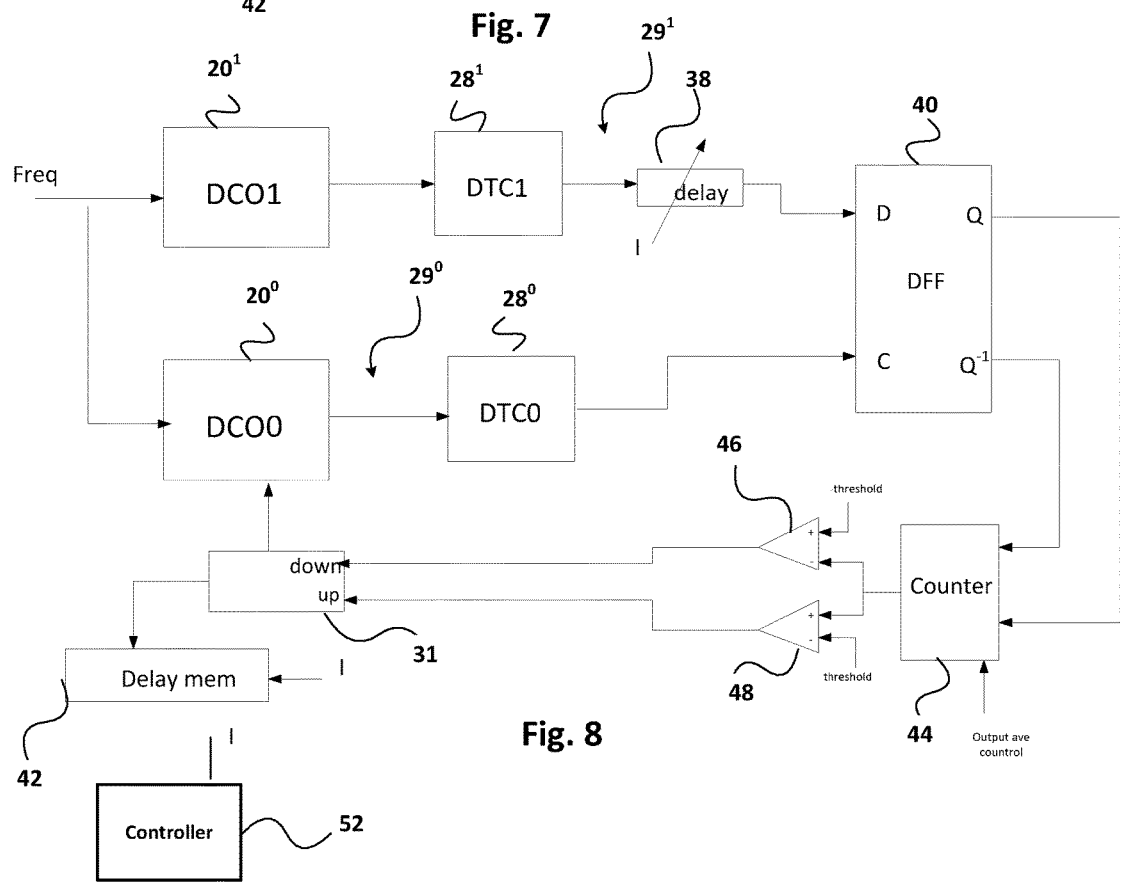
FIG. 8 shows a clock synthesizer with a delay estimation circuit.

A suitable circuit for matching the digital delay introduced into one path with the analog delay introduced into the other path is shown in FIG. 8, where the DFF 40 is used for clock delay measurement. The circuit operates under the control of controller 52, which sets the value of I.

The Q, $Q^{-1}$ outputs of DFF 40 are input to counter 44, whose output is applied to two threshold comparators 46, 48 coupled respectively to up/down inputs of up/down module 31. This adjusts the delay I*D in the delay memory 42 by small increments of Δ.

With a given actual analog delay I*dt+δ, both DCO0 and DCO1 are driven by the same DCO frequency with the same initial phase values. DCO0 will move its phase backwards or forwards based on the output of DFF 40 so as to align the two output clocks.

The output of DFF 40 will be either positive or negative depending on whether the D input is ahead or behind the driven clock. The output of the DFF 40 will be sent to the counter 44, which will add or subtract 1 (+/−1) based on DFF output. The counter 44 will be read on a controlled edge of the system clock. If the value in the counter is larger than a given threshold, it means that DCO0 is behind DCO1 and DCO0 will move its phase forward. If the counter is smaller than threshold, it means that DCO0 is ahead of DCO1 and DCO0 will move its phase backward.

If the counter value is between two thresholds, no change is made to the phase of DCO0. Gradually, the two clock phases will be aligned at the inputs of DFF 40. After alignment is completed, the adjusted DCO0 phase I*D+Δ will reflect the analog delay I*dt+δ and be stored in delay memory 42. The same procedure is be repeated for another setting of nominal analog delay I*dt to build a library of actual digital delays I*D+Δ corresponding to nominal analog delays I*dt (actual analog delays I*dt+δ).

Figure 9:
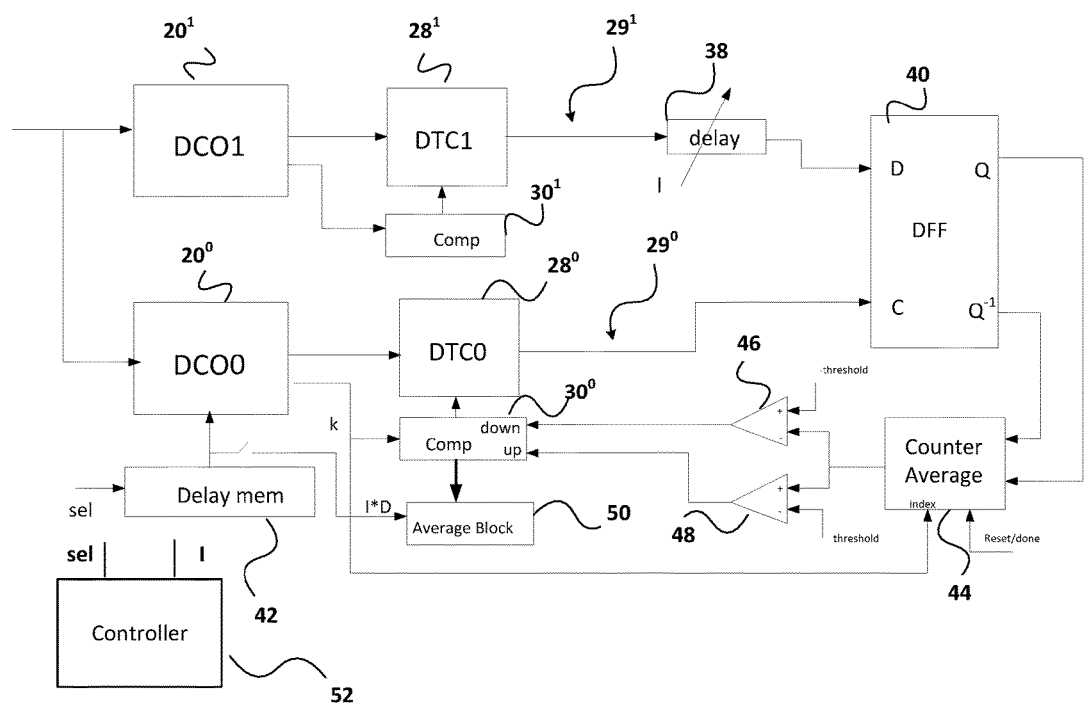
FIG. 9 shows a clock synthesizer with an INL estimation circuit in accordance with a first embodiment of the invention.

When all the nominal analog delays I*dt have been premeasured, the compensation procedure can begin as shown in FIG. 9. The controller 52 selects the nominal analog delay I*dt in delay module 38, namely a value for I, and the corresponding pre-measured nominal digital delay I*D. The delay memory 42 applies the corresponding actual digital delay I*D+Δ to DCO0. Both DCO0 and DCO1 are driven by the same frequency Freq.

The counter output average module 44 receives the Q and $Q^{-1}$ outputs of the D-type flop 40 and increments up or down depending on whether the first path leads or lags the second path. When the counter 44 exceeds a preset threshold, determined by comparator 46, it adjusts the compensation memory of DTC0 down, and when it falls below a preset threshold determined by comparator 48, it adjusts the compensation memory of DTC0 up so that clock outputs from both paths are aligned to each other.

After convergence, i.e. when the outputs of the paths $29^0$ and $29^1$ are aligned, the contents of the compensation memory x(k), which are in the form of a vector representing the INL values for each k, are dumped into a circular accumulator memory provided by the average block 50 with the index addition bias $I_b$ in accordance with the equation:

$$y(k)=y(k)+x(k-I_b),$$

where y(k) is the accumulated contents of the memory 50 and $I_b$. If DTC1 is to be compensated, the index addition bias is I*d, so the equation becomes:

$$y(k)=y(k)+x(k-\lfloor I^*d \rfloor)$$

If DTC0 is to be compensated, the index addition bias is zero, and the equation becomes:

$$y(k)=y(k)+x(k)$$

After finishing the alignment for the first delay setting, the second analog delay is selected and the previous procedure is repeated, and so on for all N values of I.

The circular memory provided by average block 50 contains the sum of all the compensation memory values for different delays. By dividing by N into the final summation and setting the first element to zero and subtracting all elements by the first element (assuming INL(0)=0), we have the average compensation value, which represents INL for DTC0 if the addition index bias is set to zero and INL for DTC1 if the addition index bias is set to the same as the initial phase of DCO0.

Figure 10:
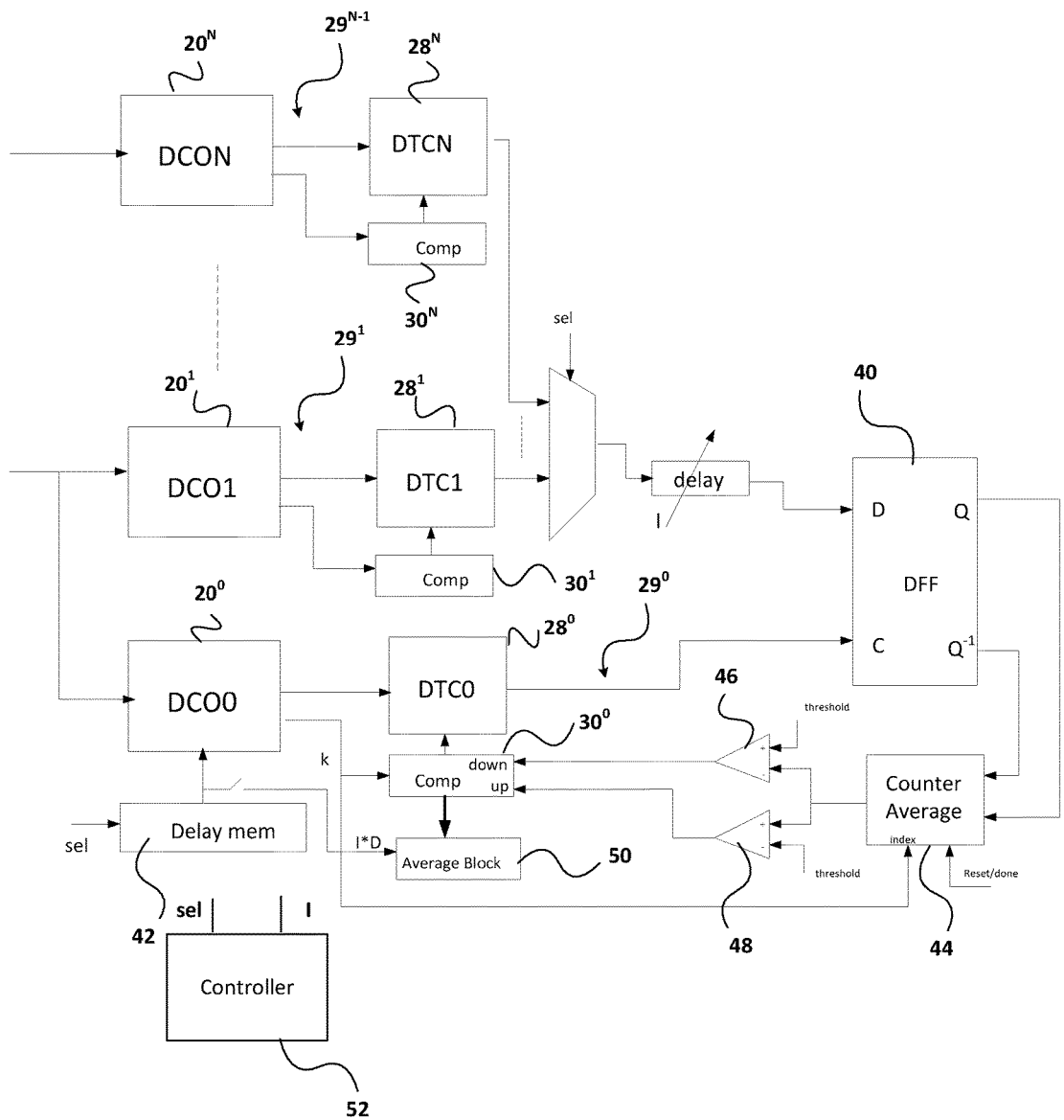
FIG. 10 shows a clock synthesizer with an INL estimation circuit in accordance with a second embodiment of the invention.

In the embodiment shown in FIG. 10, each path $29^0$ to $29^{N-1}$ constitutes a synthesizer (0 . . . N−1). Multiplexer 52 selects a synthesizer $29^{1\ldots N-1}$ that is to be calibrated. Path $29^0$ comprising DCO0 and DTC0 is the designated DTC nonlinear compensation synthesizer. Once a synthesizer has been selected, the selected synthesizer and synthesizer $29^0$ function in a similar manner to embodiment described with reference to FIG. 9. DCO0 will have the same frequency input as the selected synthesizer and its phase will be aligned with the compensated DCO plus an offset, which represents the selected analog delay just as is the case in the embodiment of FIG. 9.

During the compensating process, the compensated synthesizer (the corresponding DCO and its DTC) runs normally without interruption. When the compensation process is completed, its DTC compensation memory is updated and next synthesizer is selected with the multiplexer 38.

The embodiment shown in FIG. 10 provides real time compensation for multiple synthesizers. It can compensate any analog mismatch or nonlinearity due to temperature, voltage variations, or other factors.

Figure 11:
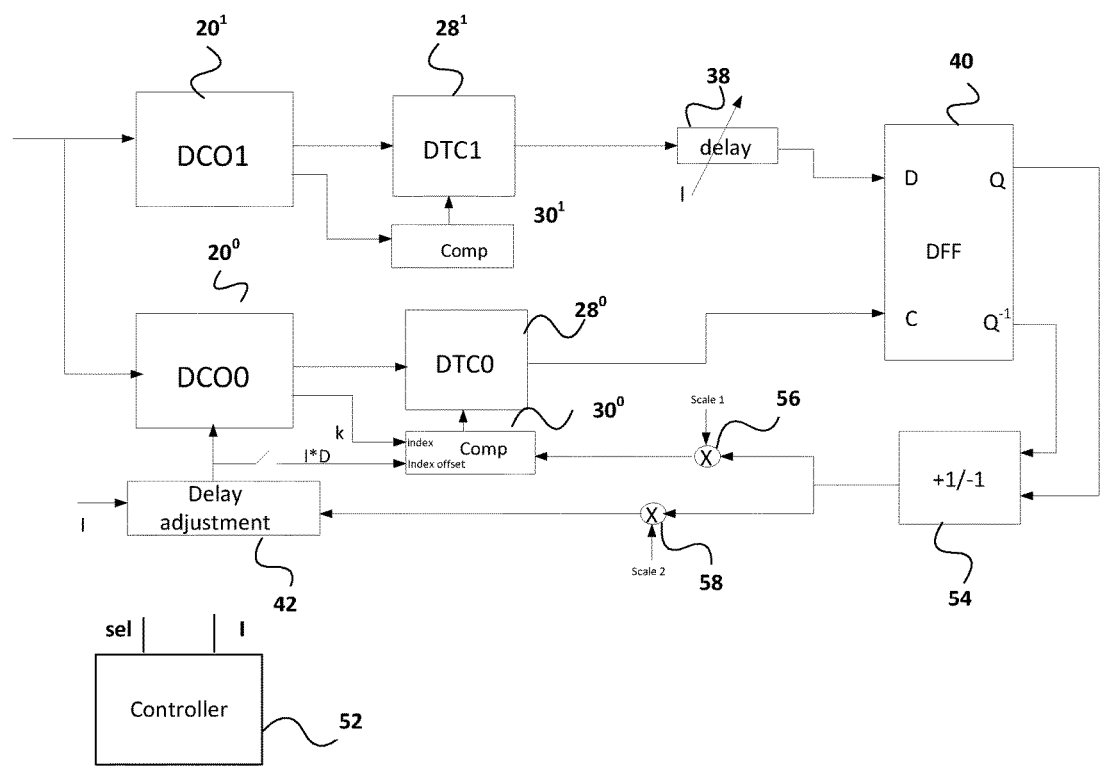
FIG. 11 shows a clock synthesizer with an INL estimation circuit in accordance with a third embodiment of the invention.

In the previous description, the dual DTC nonlinear compensation was performed in two separate steps: delay estimation and DTC compensation with variable delay setting. These two steps can be preformed concurrently to provide a combined estimate of analog delay and DTC nonlinear compensation as shown in FIG. 11. This process can be implemented as an adaptive DTC nonlinear compensation where during the adaptation process the I values are varied from 0 to N−1.

As in the case of the embodiment of FIG. 9, if the addition index bias is set to 0, the convergent result is the INL estimation for DTC0, and if the addition index bias is set as DCO0 phase delay relative to DCO1 (I*d), the convergent result will be the estimated INL for DTC1.

In FIG. 11, the output of the DFF 40 is converted to a +/−1 signed output in module 54 depending on whether the D input is leading or lagging the clock input provided by the DTC0 $20^0$. This signed output is scaled by multipliers 56, 58 to adjust both compensation memory $30^0$ for DTC0 and the value in the delay adjustment memory 42 for DCO0 with two different scaling values (Scale1 and Scale2).

The process will continue until convergence when the output pulses are aligned. During the convergence procedure, the controller 52 rotates the analog delay 0 to (N−1)*dt regularly after the INL values for each value of k have been obtained. The controller 52 also selects the corresponding value I*D in the delay memory 42, which is adaptively updated by the scaling factor Scale2 output from multiplier 58. Likewise, the compensation memory $30^0$ will be adaptively updated by the scaling factor Scale1 output by the multiplier 56. Both I and k can be changed randomly as is common in an adaptive algorithm. I can be held fixed until all values of k have been covered, or the system can continually change I and k to cover all combinations of I and k. If I is changed at random, statistically all combinations of I and k will eventually be covered.

As with any adaptive algorithm, the final error will approach a stable level. In this case, the DFF 40 output will toggle between +/−1. The final value in the compensation memory $30^0$ will be the average INL for the corresponding DTC, and the delay memory 42 will contain corresponding actual digital I delay value D+Δ for the selected nominal analog delay I*dt.

Non-limiting aspects of the invention include a novel architecture for DTC nonlinear compensation, DTC nonlinear compensation using dual PLL architecture, real time DTC nonlinear compensation to compensate for temperature variations, dual PLL compensation with added variable analog delay, multi-DPLL DTC real time compensation, joint/adaptive DTC compensation and analog delay measurement, DTC compensation for INL cancellation, and PI calibration for INL cancellation.

It should be appreciated by those skilled in the art that any block diagrams herein represent conceptual views of illustrative circuitry embodying the principles of the invention. For example, a processor may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. The functional blocks or modules illustrated herein may in practice be implemented in hardware or software running on a suitable processor, and the terms circuit or circuitry include collections of functional blocks implemented in software.

The invention claimed is:

1. A method of compensating for integral nonlinear interpolation (INL) distortion in a clock synthesizer driven by a system clock running at a frequency $f_{sys}$, comprising:
   (i) providing a first path comprising a first digital controlled oscillator (DCO) responsive to an input frequency value Freq to generate output clock pulses, a first digital-to-time converter (DTC) for linearly interpolating to a series of M interpolation points k between system clock pulses to correct the phase of the output clock pulses, a first compensation module for applying compensation values to the first DTC to correct for INL distortion, and an adjustable delay module for introducing a series of nominal analog delays I*dt, (I=0, 1, . . . N−1), where N*dt=1/$f_{sy}$s, into an output of the first DTC;

(ii) providing a second path comprising a second digital controlled oscillator (DCO) responsive to said input frequency value Freq to generate output clock pulses, a second digital-to-time converter (DTC) for linearly interpolating to a series of M interpolation points k between system clock pulses to correct the phase of the output clock pulses, a delay memory for applying nominal digital delays I*D, (I=0, 1 . . . N−1), where N*D=Freq, to the second DCO, and a second compensation module for applying compensation values to the second DTC to correct for INL distortion;

(iii) introducing a selected nominal analog delay I*dt with an actual delay of I*dt+δ, where δ is a small offset from the nominal delay, at the output of the first path and a nominal digital delay I*D with an actual delay of I*D+Δ, where Δ is a small offset from the nominal delay, at the input of the second path that offsets the actual analog delay in the first path;

(iv) adjusting contents x(k) of the second compensation module to align the output pulses of the first and second paths for different values of k;

(v) iteratively repeating steps (iii) and (iv) for all N values of I; and (vi) averaging the contents x(k) of the second compensation module to derive the compensation values to be applied to a selected one of said DTCs to correct for INL distortion.

2. The method of claim 1, comprising, at each iteration, adding said contents x(k) of said second compensation module to a value y(k) stored in a memory according to the equation:

$$y(k)=y(k)+x(k-I_b)$$

where $I_b$ is an index addition bias; and dividing the final summation by N to derive the compensation values for at least one of said first and second paths.

3. The method of claim 2, wherein said index addition bias $I_b$ is set to I*d, where d=D*M/Freq, to derive the compensation values for the first DTC.

4. The method of claim 3, wherein said index addition bias $I_b$ is set to zero to derive the compensation values for the second DTC.

5. The method of claim 1, wherein pairs of actual offsetting analog and digital delays I*dt+δ and I*D+Δ are predetermined by maintaining a counter that is incremented or decremented depending on whether the output of the first path is ahead or behind the second path, moving the phase of the digital delay in second DCO forward or backward depending on the value in said counter compared to first and second thresholds, and storing the matching actual values in memory.

6. The method of claim 5, wherein the outputs of said first and second paths are applied to data and clock inputs of a D-type flip-flop whose Q and $Q^{-1}$ outputs drive said counter.

7. The method as claimed of claim 1, comprising maintaining a counter that is incremented or decremented depending on whether the output of the first path is ahead or behind the second path, and adjusting the compensation values in said second compensation module depending on the value in said counter compared to first and second thresholds, and storing the matching actual values in memory.

8. The method as claimed of claim 7, wherein the outputs of said first and second paths are applied to data and clock inputs of a D-type flip-flop whose Q and $Q^{-1}$ outputs drive said counter.

9. The method as claimed of claim 1, further comprising providing a series of additional first paths sharing said adjustable delay module via a multiplexer, wherein any one of said first paths is selectable as active by said multiplexer.

10. The method of claim 1, wherein the actual analog and digital delays are determined concurrently with the compensation values.

11. The method of claim 10, wherein depending on whether the output of the first path is ahead or behind the second path the compensation value in said second compensation module and said digital delay are incremented or decremented with respective scaling factors until the outputs of said first and second paths are aligned while the nominal analog delay is I*dt is continually rotated through 0 to (N−1)dt.

12. A clock synthesizer with nonlinear digital-to-time conversion compensation driven by system clock pulses, comprising:

a first path comprising a first digital controlled oscillator (DCO) responsive to an input frequency value Freq to generate output clock pulses, a first digital-to-time converter (DTC) for linearly interpolating between system clock pulses to correct the phase of the output clock pulses, a first compensation module for applying compensation values to the first DTC to correct for integral nonlinear interpolation (INL) distortion, and an adjustable delay module for introducing a series of nominal analog delays I*dt, (I=0, 1, . . . N−1), where N*dt=1/$f_{sy}$s, into an output of the first DTC;

a second path comprising a second digital controlled oscillator (DCO) responsive to said input frequency value Freq to generate output clock pulses, a second digital-to-time converter (DTC) for linearly interpolating to a series of M interpolation points k between system clock pulses to correct the phase of the output clock pulses, and a delay memory for applying nominal initial delays I*D, (I=0, 1 . . . N−1), where N*D=Freq, to the second DCO, and a second compensation module for applying a compensation values to the second DTC to correct for INL distortion;

a controller programmed to:

(i) introduce a selected nominal analog delay I*dt with an actual delay of I*dt+δ, where δ is a small offset from the nominal delay, at the output of the first path and a nominal digital delay I*D with an actual delay of I*D+Δ, where Δ is a small offset from the nominal delay, at the input of the second path that offsets the actual analog delay in the first path;

(ii) adjust contents x(k) of the second compensation module to align the output clock pulses from the first and second paths for different values of k;

(iii) iteratively repeat steps (i) and (ii) for all N values of I; and (iv) average the contents x(k) of the second compensation module to derive the compensation values to be applied to a selected one of said DTCs to correct for INL distortion.

13. The clock synthesizer of claim 12, wherein said controller is programmed to add, at each iteration, said contents x(k) of said second compensation module to a value y(k) stored in a memory according to the equation:

$$y(k)=y(k)+x(k-I_b)$$

where $I_b$ is an index addition bias; and divide the final summation by N to derive the compensation values for at least one of said first and second paths.

14. The clock synthesizer of claim 13, wherein said controller is programmed to set the index addition bias $I_b$ is to I*d, where d=D*M/Freq, to derive the compensation values for the first DTC.

15. The clock synthesizer of claim 13, wherein said controller is programmed to set the index addition bias $I_b$ to zero to derive the compensation values for the second DTC.

16. The clock synthesizer of claim 12, further comprising a counter that is incremented or decremented depending on whether the output of the first path is ahead or behind the second path, an up/down module for moving the phase of the digital delay in second DCO forward or backward depending on the value in said counter compared to first and second thresholds, and a memory for storing the matching actual values of the digital delays I*D+Δ offsetting the actual analog delays I*dt+δ.

17. The clock synthesizer of claim 16, further comprising a D-type flip-flop whose data and clock inputs are connected to the outputs of the respective first and second paths and whose respective Q and $Q^{-1}$ outputs are coupled to said counter.

18. The clock synthesizer as claimed of claim 12, further comprising a counter that is incremented or decremented depending on whether the output of the first path is ahead or behind the second path, and threshold comparators for adjusting the compensation values in said second compensation module depending on the value in said counter compared to first and second thresholds.

19. The clock synthesizer of claim 18, further comprising a D-type flip-flop having data and clock inputs coupled to the outputs of said respective first and second paths and whose Q and $Q^{-1}$ outputs drive said counter.

20. The clock synthesizer of claim 12, further comprising providing a series of additional first paths, and a multiplexer for connecting any selected one of said first paths to said delay module.

21. The clock synthesizer of claim 12, further comprising a counter that is incremented or decremented depending on whether the output of the first path is ahead or behind the second path, and threshold comparators the compensation values in said second compensation module with a first scaling factor and the delay in said delay memory with a second scaling factor depending on the value in said counter compared to first and second thresholds until the outputs of said first and second paths are aligned, and said controller being programmed to continually rotate the nominal analog delay is I*dt through 0 to (N−1)dt.

22. A clock synthesizer with nonlinear digital-to-time conversion compensation driven by system clock pulses, comprising:

a first path comprising a first digital controlled oscillator (DCO) responsive to an input frequency value Freq to generate output clock pulses, a first digital-to-time converter (DTC) for linearly interpolating between system clock pulses to correct the phase of the output clock pulses, a first compensation module for applying compensation values to the first DTC to correct for integral nonlinear interpolation (INL) distortion, and an adjustable delay module for introducing a series of nominal analog delays I*dt, (I=0, 1, . . . N−1), where N*dt=1/$f_{sys}$, into an output of the first DTC;

a second path comprising a second digital controlled oscillator (DCO) responsive to said input frequency value Freq to generate output clock pulses, a second digital-to-time converter (DTC) for linearly interpolating to a series of M interpolation points k between system clock pulses to correct the phase of the output clock pulses, and a delay memory for applying nominal initial delays I*D, (I=0, 1 . . . N−1), where N*D=Freq, to the second DCO, and a second compensation module for applying a compensation values to the second DTC to correct for INL distortion;

a controller programmed to introduce a selected nominal analog delay I*dt with an actual delay of I*dt+δ, where δ is a small offset from the nominal delay, at the output of the first path and a nominal digital delay I*D with an actual delay of I*D+Δ, where Δ is a small offset from the nominal delay, at the input of the second path that offsets the actual analog delay in the first path.

* * * * *